US010153429B2

(12) United States Patent
Kamata et al.

(10) Patent No.: US 10,153,429 B2
(45) Date of Patent: Dec. 11, 2018

(54) MEMORY DEVICE

(71) Applicant: Toshiba Memory Corporation, Tokyo (JP)

(72) Inventors: Yoshiki Kamata, Tokyo (JP); Yoshiaki Asao, Kawasaki Kanagawa (JP); Iwao Kunishima, Yokohama Kanagawa (JP); Misako Morota, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/635,685

(22) Filed: Jun. 28, 2017

(65) Prior Publication Data

US 2018/0006216 A1    Jan. 4, 2018

(30) Foreign Application Priority Data

Jun. 30, 2016   (JP) ................................. 2016-130946

(51) Int. Cl.
*H01L 45/00* (2006.01)
*G11C 13/00* (2006.01)

(52) U.S. Cl.
CPC ............ *H01L 45/06* (2013.01); *G11C 13/004* (2013.01); *G11C 13/0004* (2013.01); *G11C 13/0028* (2013.01); *H01L 45/1233* (2013.01); *H01L 45/1253* (2013.01); *H01L 45/144* (2013.01); *H01L 45/04* (2013.01)

(58) Field of Classification Search
CPC ............................ H01L 45/1233; H01L 45/04
See application file for complete search history.

(56) References Cited

U.S. PATENT DOCUMENTS

| 8,803,119 | B2 | 8/2014 | Morikawa et al. |
| 9,825,096 | B2 * | 11/2017 | Ota ..................... H01L 45/1226 |
| 9,893,280 | B2 * | 2/2018 | Suzuki ................. H01L 45/144 |
| 2013/0221310 | A1 | 8/2013 | Morikawa et al. |
| 2016/0268342 | A1 * | 9/2016 | Takashima .......... H01L 45/1233 |

FOREIGN PATENT DOCUMENTS

JP    2013175570 A    9/2013

OTHER PUBLICATIONS

Hong Sik Yoon et al., Vertical Cross-point Resistance Change Memory for Ultra-High Density Non-volatile Memory Applications, 2009 Symposium on VLSI Technology Digest of Technical Papers, 2B-2, pp. 26-27.

* cited by examiner

*Primary Examiner* — Nicholas Tobergte
(74) *Attorney, Agent, or Firm* — Patterson & Sheridan, LLP

(57) ABSTRACT

A memory device according to an embodiment includes a first conductive layer, a second conductive layer, a third conductive layer intersecting the first conductive layer and the second conductive layer, and a resistance change layer including a first region which is provided between the first conductive layer and the third conductive layer and has a superlattice structure, a second region which is provided between the second conductive layer and the third conductive layer and has the superlattice structure, and a third region which is provided between the first region and the second region. The third region includes at least one element selected from the group consisting of O, F, C, P, B, N, H, Bi, Cd, Zn, Ga, Se, Al, S, Be, In, and Pb. Concentration of the at least one element in the third region is higher than that in the first region and the second region.

11 Claims, 15 Drawing Sheets

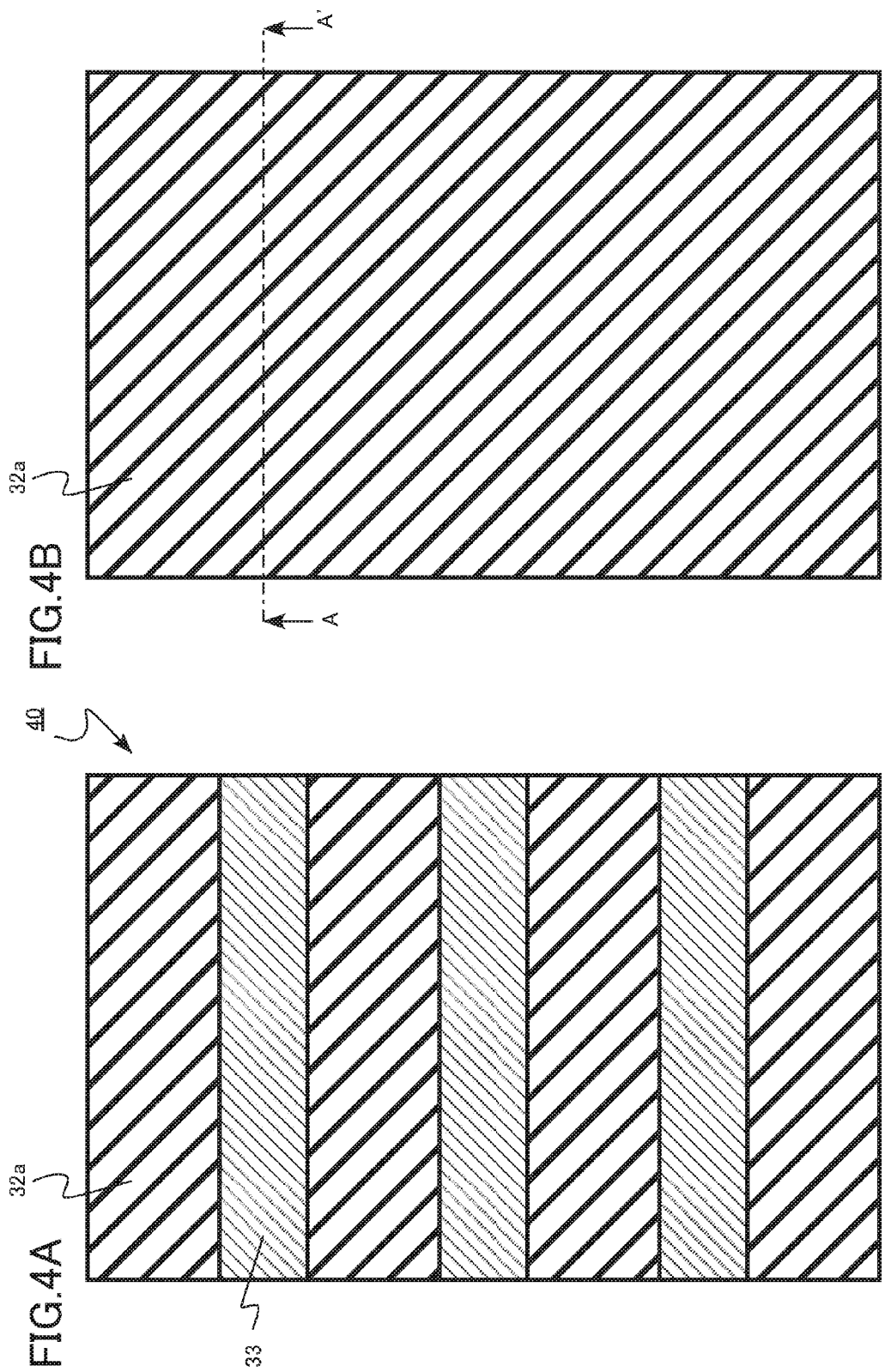

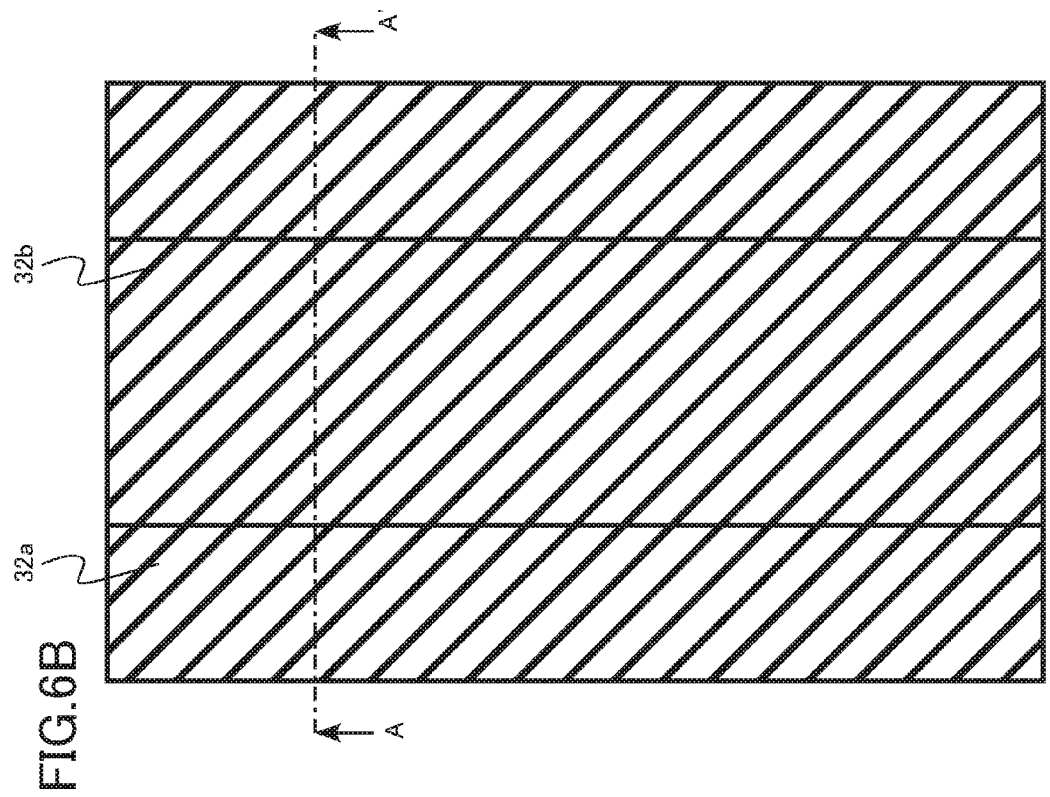
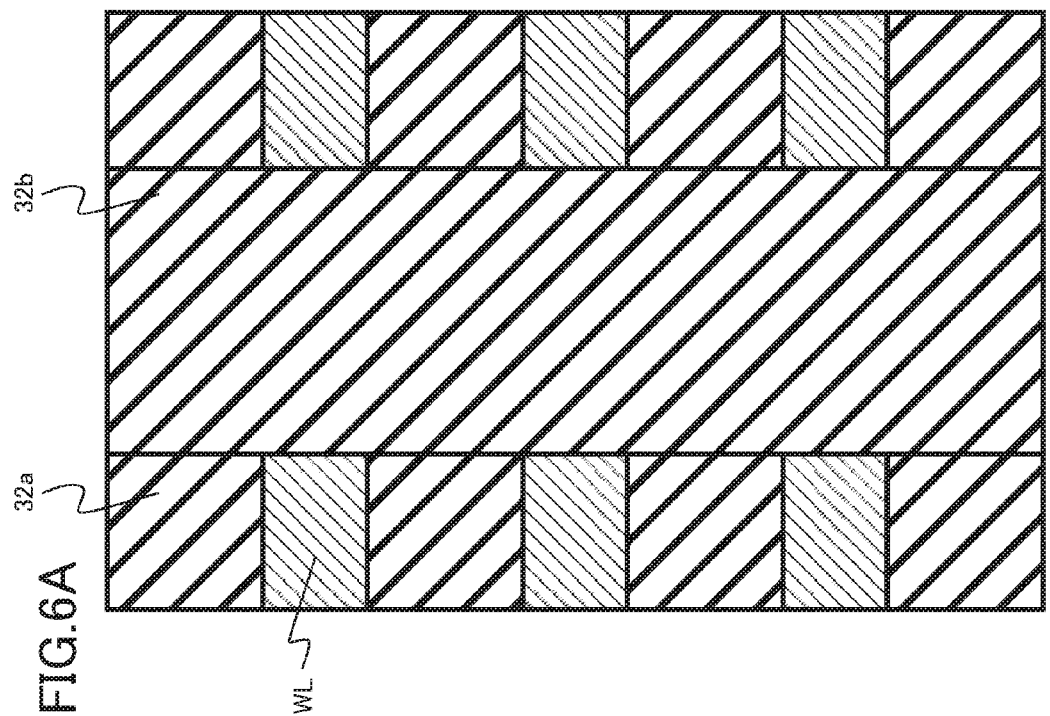

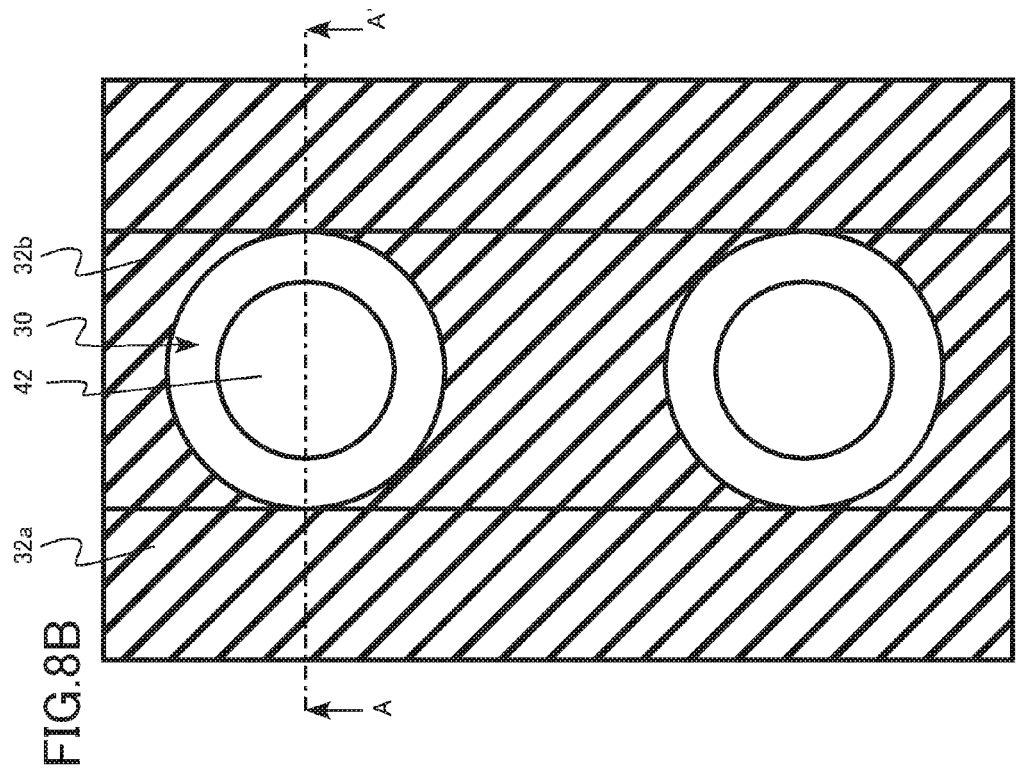
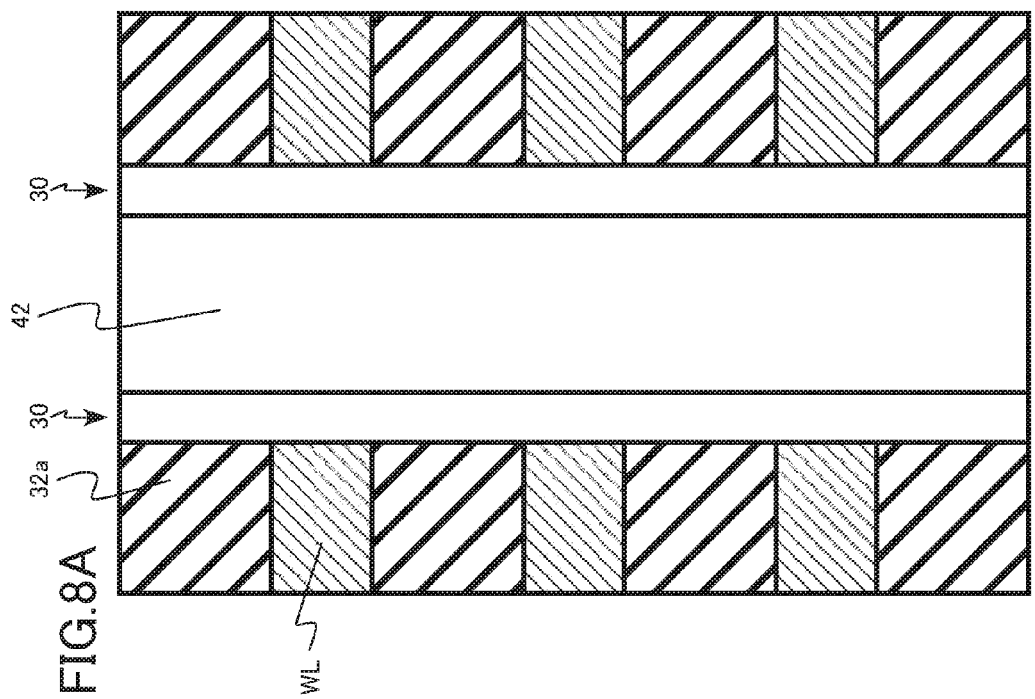

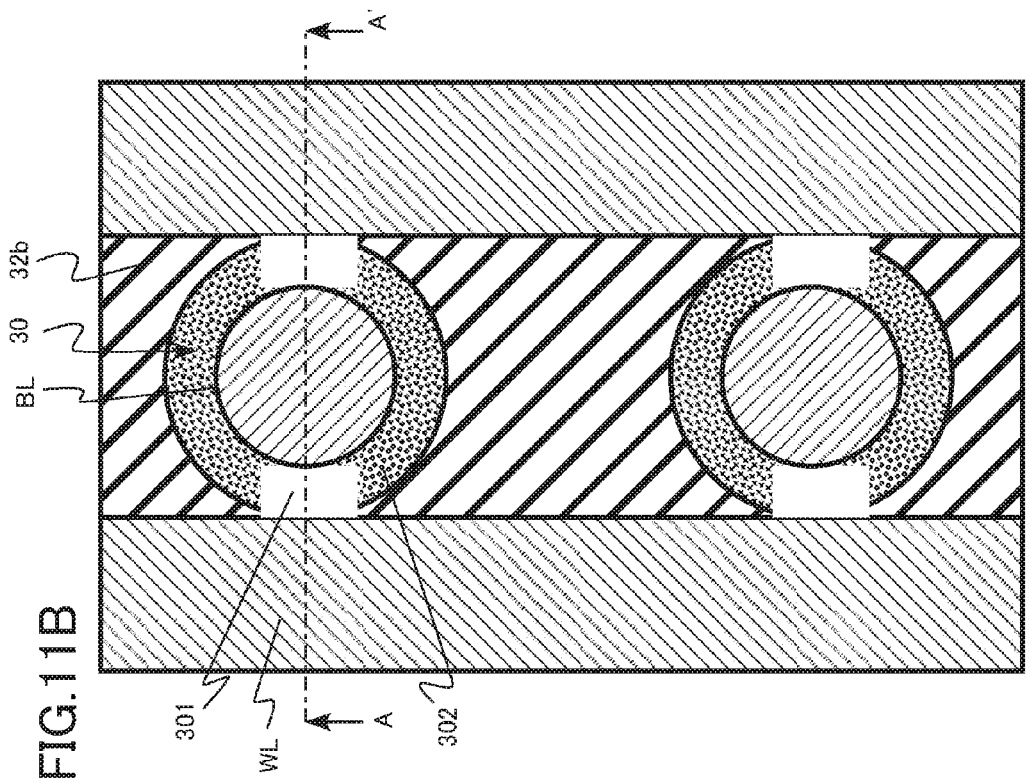
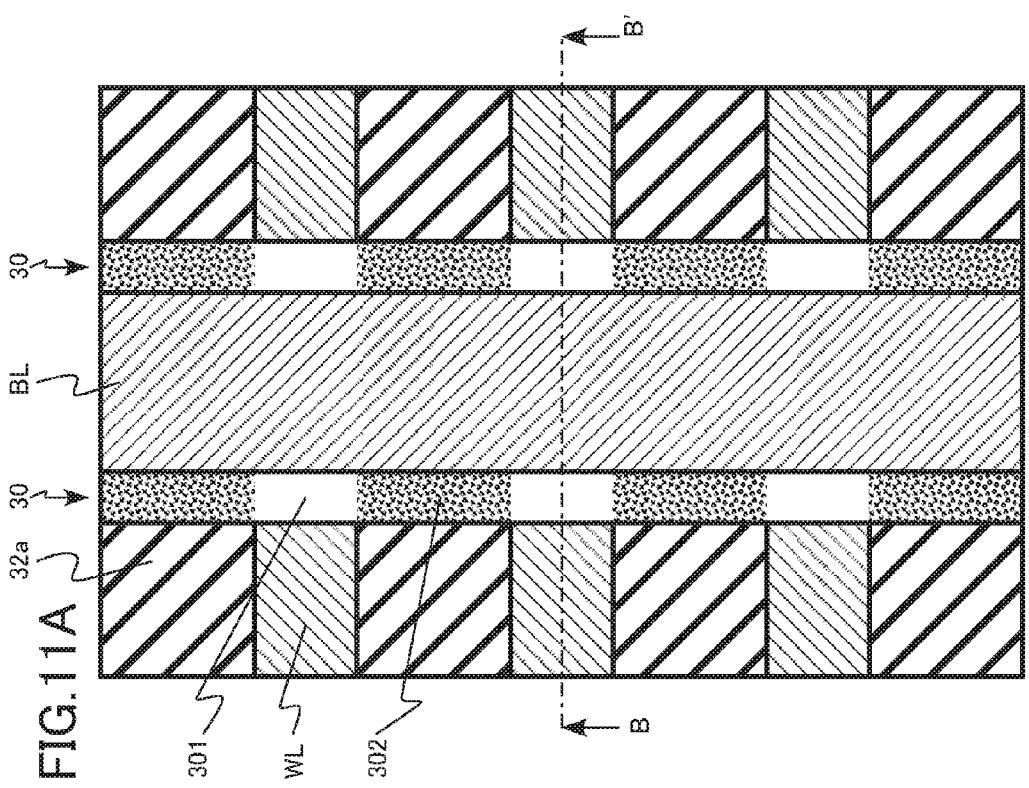

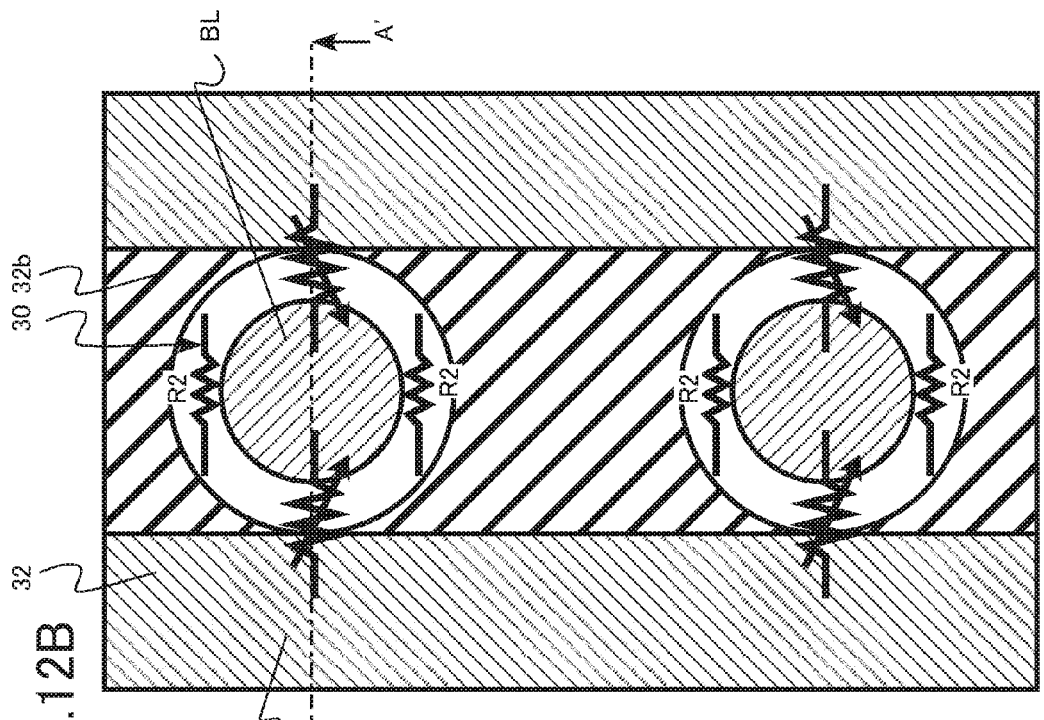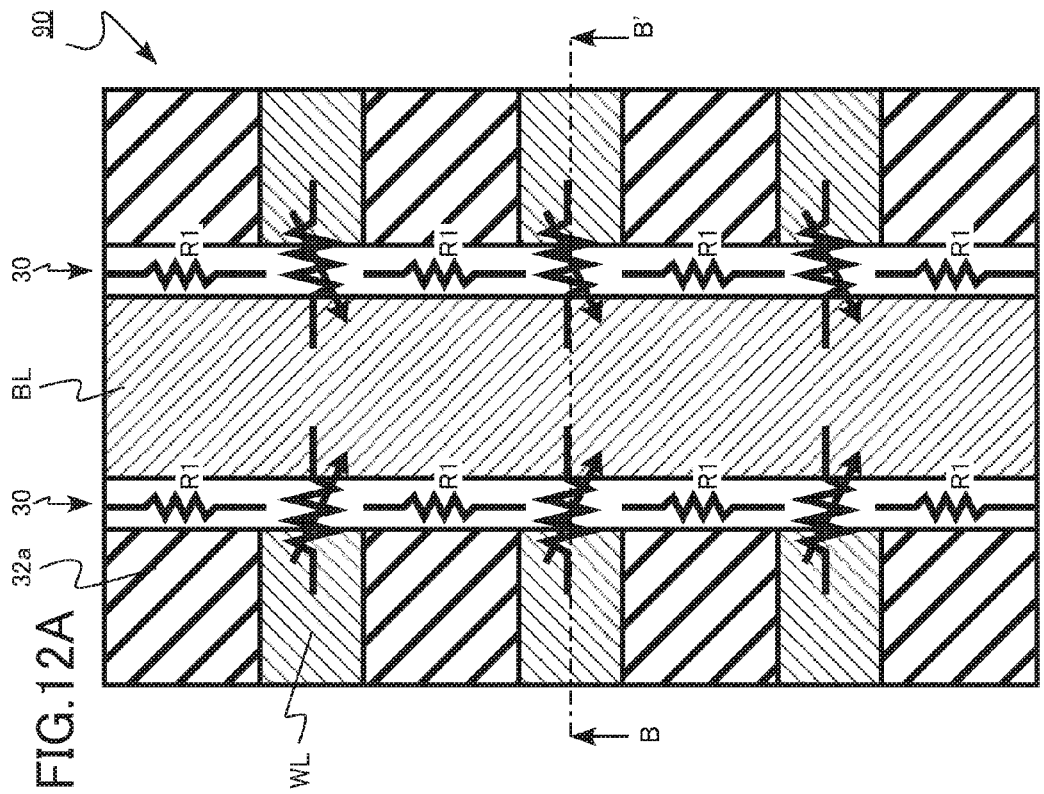

MEMORY DEVICE

CROSS-REFERENCE TO RELATED APPLICATION

This application is based upon and claims the benefit of priority from Japanese Patent Application No. 2016-130946, filed on Jun. 30, 2016, the entire contents of which are incorporated herein by reference.

FIELD

Embodiments described herein relate generally to memory devices.

BACKGROUND

One example of a resistance-change memory is a superlattice phase-change memory. The superlattice phase-change memory uses a change in resistance associated with a change in a superlattice structure.

With the scaling-down of the resistance-change memory, the distance between adjacent memory cells is reduced, which causes mutual interference between adjacent memory cells. The mutual interference between adjacent memory cells causes operation errors. The superlattice phase-change memory is no exception and it is preferable to prevent the mutual interference between adjacent memory cells.

BRIEF DESCRIPTION OF THE DRAWINGS

FIGS. 4A and 4B are cross-sectional views schematically illustrating the memory device which is being manufactured in a memory device manufacturing method according to the first embodiment;

FIGS. 6A and 6B are cross-sectional views schematically illustrating the memory device which is being manufactured in the memory device manufacturing method according to the first embodiment;

FIGS. 8A and 8B are cross-sectional views schematically illustrating the memory device which is being manufactured in the memory device manufacturing method according to the first embodiment;

FIGS. 11A and 11B are cross-sectional views schematically illustrating the memory device which is being manufactured in the memory device manufacturing method according to the first embodiment;

FIGS. 12A and 12B are diagrams illustrating the function and effect of the memory device according to the first embodiment.

DETAILED DESCRIPTION

A memory device according to an embodiment includes a first conductive layer extending in a first direction; a second conductive layer extending in the first direction, a third conductive layer intersecting the first conductive layer and the second conductive layer, and a resistance change layer including a first region provided between the first conductive layer and the third conductive layer, a second region provided between the second conductive layer and the third conductive layer, and a third region provided between the first region and the second region, the first region having a superlattice structure, the second region having a superlattice structure, the third region including at least one element selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb), concentration of the at least one element in the third region being higher than that in the first region and the second region.

In the specification, a "superlattice structure" means a structure in which a plurality of types of crystal lattice layers being stacked.

Hereinafter, memory devices according to embodiments will be described with reference to the drawings.

First Embodiment

A memory device according to this embodiment includes a first conductive layer extending in a first direction, a second conductive layer extending in the first direction, a third conductive layer intersecting the first conductive layer and the second conductive layer, and a resistance change layer. The resistance change layer includes a first region which is provided between the first conductive layer and the third conductive layer and has a superlattice structure, a second region which is provided between the second conductive layer and the third conductive layer and has the superlattice structure, and a third region which is provided between the first region and the second region and includes at least one element selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb). The at least one element has a higher concentration in the third region than that in the first region and the second region.

Figure 1:
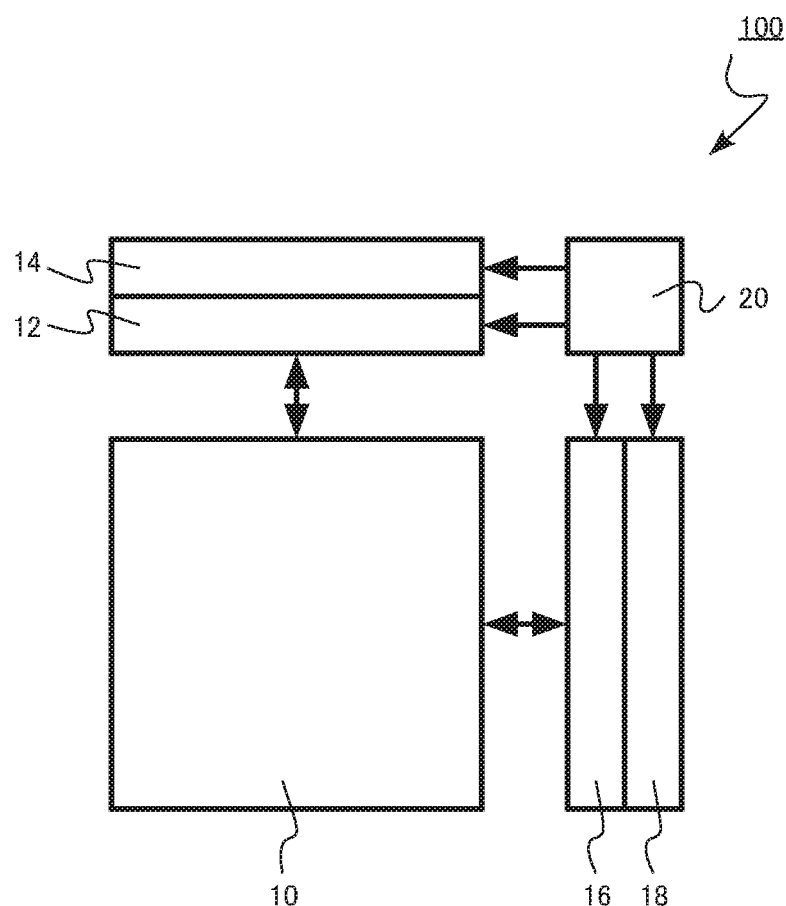
FIG. 1 is a block diagram illustrating a memory device according to a first embodiment.
Figure 2:
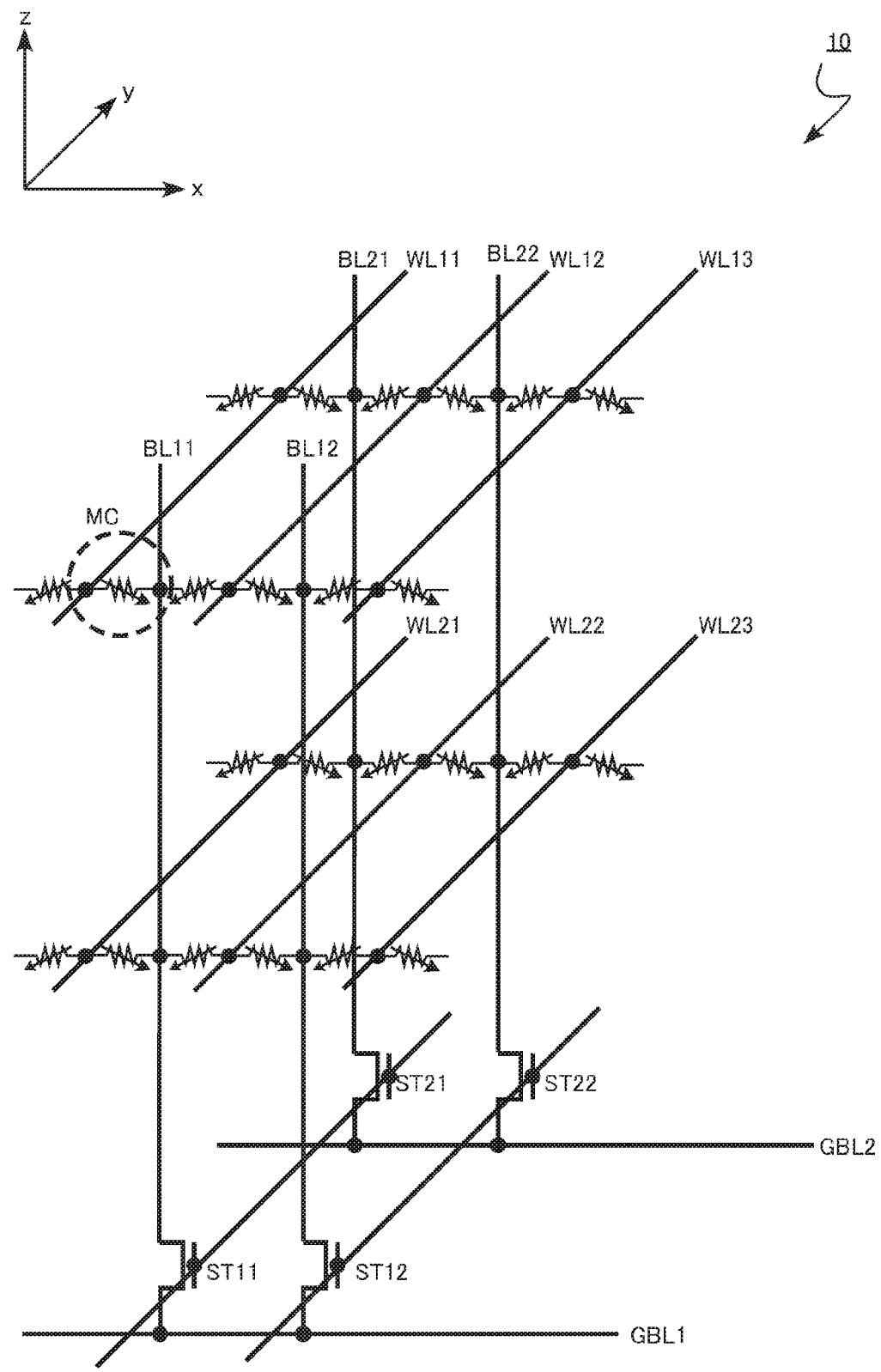
FIG. 2 is an equivalent circuit diagram illustrating a memory cell array according to the first embodiment.

FIG. 1 is a block diagram illustrating the memory device according to this embodiment. FIG. 2 is an equivalent circuit diagram illustrating a memory cell array. FIG. 2 schematically illustrates a wiring structure in the memory cell array.

A memory device 100 according to this embodiment is a superlattice phase-change memory. The superlattice phase-change memory stores data, using a change in resistance associated with a change in a superlattice structure in a resistance change layer.

The memory cell array according to this embodiment has a three-dimensional structure in which memory cells MC are three-dimensionally arranged. The use of the three-dimensional structure makes it possible to improve the degree of integration of the memory device 100.

As illustrated in FIG. 1, the memory device 100 includes a memory cell array 10, a word line driver circuit 12, a row decoder circuit 14, a sense amplifier circuit 16, a column decoder circuit 18, and a control circuit 20.

As illustrated in FIG. 2, a plurality of memory cells MC are three-dimensionally arranged in the memory cell array 10. In FIG. 2, a region surrounded by a dashed line corresponds to one memory cell MC.

The memory cell array 10 includes a plurality of word lines WL (WL11, WL12, WL13, WL21, WL22, and WL23) and a plurality of bit lines BL (BL11, BL12, BL21, and BL22). The word line WL extends in the y direction (first direction). The bit line BL extends in the z direction (second direction). The word line WL and the bit line BL are perpendicular to each other. The memory cell MC is disposed at an intersection portion between the word line WL and the bit line BL. The word line 21 is provided below the word line WL11.

The plurality of word lines WL are electrically connected to the row decoder circuit 14. The plurality of bit lines BL are electrically connected to the sense amplifier circuit 16. Select transistors ST (ST11, ST21, ST12, and ST22) and global bit lines GBL (GBL1 and GBL2) are provided between the plurality of bit lines BL and the sense amplifier circuit 16.

The row decoder circuit 14 has a function of selecting a word line WL on the basis of an input row address signal. The word line driver circuit 12 has a function of applying a predetermined voltage to the word line WL selected by the row decoder circuit 14.

The column decoder circuit 18 has a function of selecting a bit line BL on the basis of an input column address signal. The sense amplifier circuit 16 has a function of applying a predetermined voltage to the bit line BL selected by the column decoder circuit 18. In addition, the sense amplifier circuit 16 has a function of detecting a current flowing between the selected word line WL and the selected bit line BL and amplifying the current.

The control circuit 20 has a function of controlling the word line driver circuit 12, the row decoder circuit 14, the sense amplifier circuit 16, the column decoder circuit 18, and other circuits (not illustrated).

Circuits, such as the word line driver circuit 12, the row decoder circuit 14, the sense amplifier circuit 16, the column decoder circuit 18, and the control circuit 20, are formed by, for example, transistors using semiconductor layers (not illustrated) and wiring layers.

Figure 3:
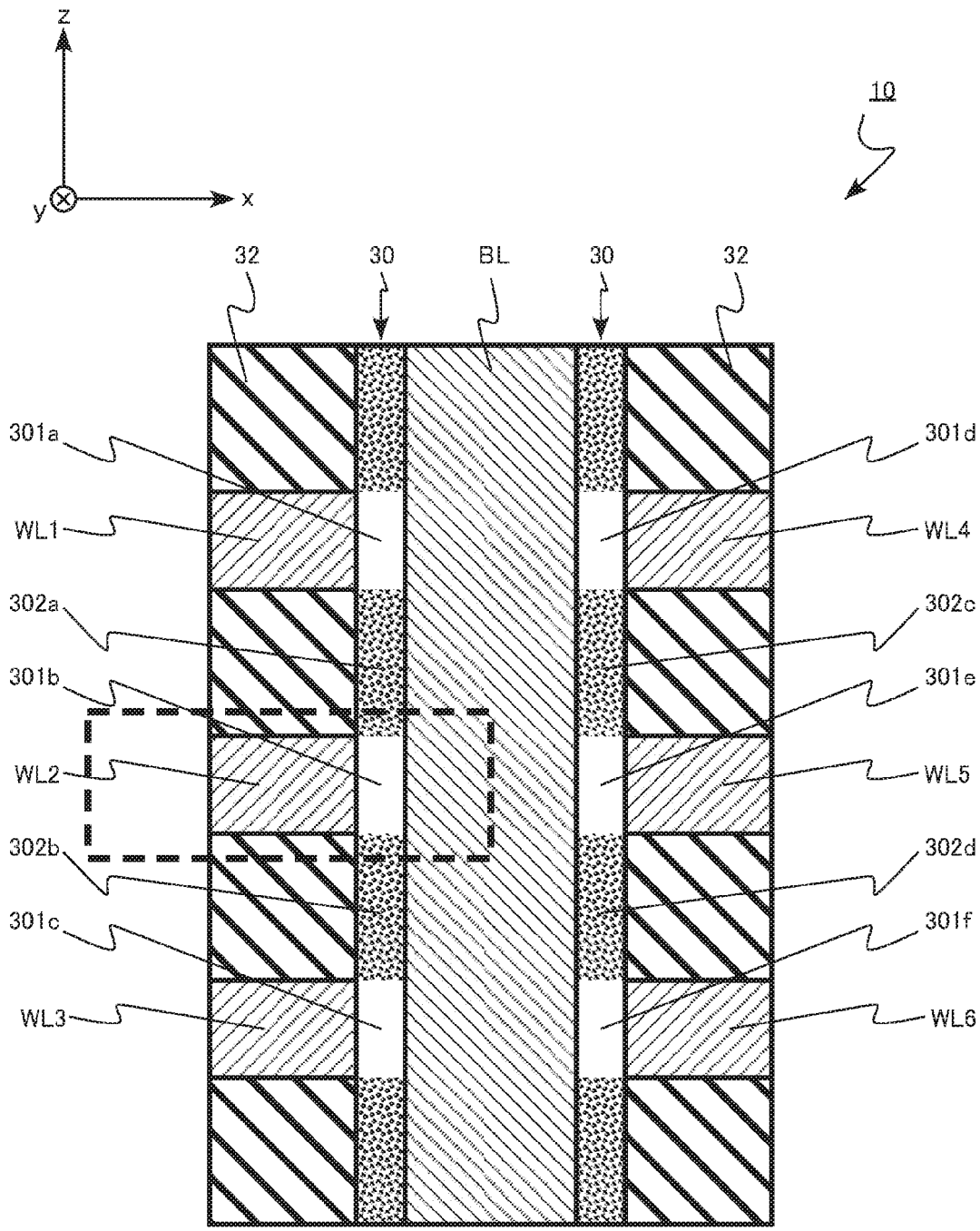
FIG. 3 is a cross-sectional view schematically illustrating the memory device according to the first embodiment.

FIG. 3 is a cross-sectional view schematically illustrating the memory cell array 10 of the memory device 100 according to this embodiment. FIG. 3 is a cross-sectional view illustrating a portion of the memory cell array 10.

FIG. 3 is a cross-sectional view that is parallel to an xz plane in FIG. 2. FIG. 3 is a cross-sectional view illustrating one bit line BL and six word lines WL perpendicular to the one bit line BL in FIG. 2. In FIG. 3, a region surrounded by a dashed line is one memory cell MC.

The memory cell array 10 includes a first word line WL1 (first conductive layer), a second word line WL2 (second conductive layer), a third word line WL3, a fourth word line WL4, a fifth word line WL5, a sixth word line WL6, the bit line BL (third conductive layer), a resistance change layer 30, and an insulating layer 32. The resistance change layer 30 includes low impurity concentration region 301a (first region), a low impurity concentration region 301b (second region), a low impurity concentration region 301c, a low impurity concentration region 301d, a low impurity concentration region 301e, and a low impurity concentration region 301f. In addition, the resistance change layer 30 includes a high impurity concentration region 302a (third region), a high impurity concentration region 302b, a high impurity concentration region 302c, and a high impurity concentration region 302d.

Hereinafter, in some cases, the first word line WL1 (first conductive layer), the second word line WL2 (second conductive layer), the third word line WL3, the fourth word line WL4, the fifth word line WL5, and the sixth word line WL6 are generically and simply referred to as word lines WL. In addition, in some cases, the low impurity concentration region 301a (first region), the low impurity concentration region 301b (second region), the low impurity concentration region 301c, the low impurity concentration region 301d, the low impurity concentration region 301e, and the low impurity concentration region 301f are generically and simply referred to as low impurity concentration regions 301. In some cases, the high impurity concentration region 302a (third region), the high impurity concentration region 302b, the high impurity concentration region 302c, and the high impurity concentration region 302d are generically and simply referred to as high impurity concentration regions 302.

The word line WL is a conductive layer. The word line WL is, for example, a metal layer. The word line WL includes, for example, tungsten (W). The word line WL may be made of a conductive material, such as other kinds of metal, a metal semiconductor compound, or a semiconductor.

The bit line BL is a conductive layer. The bit line BL is, for example, a metal layer. The bit line BL includes, for example, tungsten (W). The bit line BL may be made of a conductive material, such as other kinds of metal, a metal semiconductor compound, or a semiconductor.

At least a portion of the resistance change layer 30 is provided between each word line WL and the bit line BL.

The resistance change layer 30 is, for example, a continuous film. The thickness of the resistance change layer 30 is, for example, equal to or greater than 5 nm and equal to or less than 50 nm.

The low impurity concentration region 301 is provided between each word line WL and the bit line BL. The low impurity concentration region 301 has a superlattice structure.

The low impurity concentration region 301 stores data, using a change in a resistance state. A voltage or a current can be applied to the low impurity concentration regions 301a to 301f to rewrite data. The resistance change layer 30 is changed between a high resistance state and a low resistance state by the application of a voltage or a current. For example, the high resistance state is defined as data "0" and the low resistance state is defined as data "1". The memory cell MC stores 1-bit data such as "0" or "1".

For example, a voltage is applied between the first word line WL1 and the bit line BL to change the resistance state of the low impurity concentration region 301a.

The low impurity concentration region 301 has, for example, a superlattice structure in which a first crystal layer made of a first chalcogen compound and a second crystal layer made of a second chalcogen compound different from the first chalcogen compound are alternately stacked.

The chalcogen compound includes at least one chalcogen element selected from the group consisting of sulfur (S), selenium (Se), and tellurium (Te).

The first chalcogen compound is, for example, $Sb_2Te_3$ and the first crystal layer is, for example, a $Sb_2Te_3$ layer. The second chalcogen compound is, for example, GeTe and the second crystal layer is, for example, a GeTe layer. In this case, the low impurity concentration region 301 is made of a compound including germanium (Ge), antimony (Sb), and tellurium (Te).

The superlattice structure of the low impurity concentration region 301 is changed by the application of a voltage or a current and the low impurity concentration region 301 is changed between the high resistance state and the low resistance state.

The high impurity concentration region 302 is provided between two low impurity concentration regions 301. For example, the high impurity concentration region 302a is provided between the low impurity concentration region 301a and the low impurity concentration region 301b.

The high impurity concentration region 302 has, for example, a superlattice structure in which a $Sb_2Te_3$ layer and a GeTe layer are alternately stacked. The high impurity concentration region 302 is made of, for example, a compound including germanium (Ge), antimony (Sb), and tellurium (Te). The high impurity concentration region 302 may be amorphous.

The high impurity concentration region 302 includes as impurities, at least one element X selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb). The concentration of the element X in the high impurity concentration region 302 is higher than the concentration of the element X in the low impurity concentration region 301.

The concentration of the element X in the high impurity concentration region 302 is, for example, equal to or greater than $1\times10^{16}$ cm$^{-3}$ and equal to or less than $1\times10^{20}$ cm$^{-3}$. The concentration of the element X in the high impurity concentration region 302 is, for example, higher than the concentration of the element X in the low impurity concentration region 301 by one digit or more.

The electric resistivity of the high impurity concentration region 302 is higher than the electric resistivity of the low impurity concentration region 301. The electric resistivity of the high impurity concentration region 302 is, for example, equal to or more than ten times the electric resistivity of the low impurity concentration region 301.

Each insulating layer 32 is provided between the word lines WL. The insulating layer 32 has a function of electrically separating the word lines WL.

The insulating layer 32 includes the element X as a main component or an impurity element of the insulating layer 32. The concentration of the element X in the insulating layer 32 is, for example, higher than the concentration of the element X in the low impurity concentration region 301.

The insulating layer 32 is made of, for example, silicon oxide or silicon oxynitride.

Whether or not the resistance change layer 30 has a superlattice structure and whether or not the resistance change layer 30 is amorphous can be determined by, for example, scanning transmission electron microscopy (STEM). In addition, the elements included in the resistance change layer 30 and the elements included in the insulating layer 32 can be identified by energy dispersive X-ray spectroscopy (EDX). The magnitude relationship between the concentration of the element in the resistance change layer 30 and the concentration of the element in the insulating layer 32 can be determined by, for example, EDX. In addition, the concentration of the element in the resistance change layer 30 and the concentration of the element in the insulating layer 32 can be measured by electron energy-loss spectroscopy (EELS).

Next, a method for manufacturing the memory device 100 according to this embodiment, particularly, a method for manufacturing the memory cell array 10 will be described. FIGS. 4A, 4B, 5A, 5B, 6A, 6B, 7A, 7B, 8A, 8B, 9A, 9B, 10A, and 10B are cross-sectional views schematically illustrating the memory device that is being manufactured by the memory device manufacturing method according to the first embodiment.

FIGS. 4A, 5A, 6A, 7A, 8A, 9A, and 10A are cross-sectional views illustrating a portion of the memory cell array 10. FIGS. 4A, 5A, 6A, 7A, 8A, 9A, and 10A illustrate a cross section parallel to the xz plane in the coordinate axes illustrated in FIG. 3.

FIGS. 4B, 5B, 6B, 7B, 8B, 9B, and 10B are top views of FIGS. 4A, 5A, 6A, 7A, 8A, 9A, and 10A. FIGS. 4B, 5B, 6B, 7B, 8B, 9B, and 10B illustrate a plane parallel to the xy plane in the coordinate axes illustrated in FIG. 3. FIGS. 4A, 5A, 6A, 7A, 8A, 9A, and 10A correspond to the cross sections taken along the line AA' in FIGS. 4B, 5B, 6B, 7B, 8B, 9B, and 10B, respectively.

First, a stacked body 40 in which an insulating film 32a which will be a portion of the insulating layer 32 illustrated in FIG. 3 and a metal film 33 which will be the word line WL are alternately stacked in the z direction is formed (FIGS. 4A and 4B). The insulating film 32a includes at least one element X selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb).

For example, the insulating film 32a and the metal film 33 are alternately deposited by a chemical vapor deposition (CVD) method or a sputtering method to form the stacked body 40.

Figure 5B:
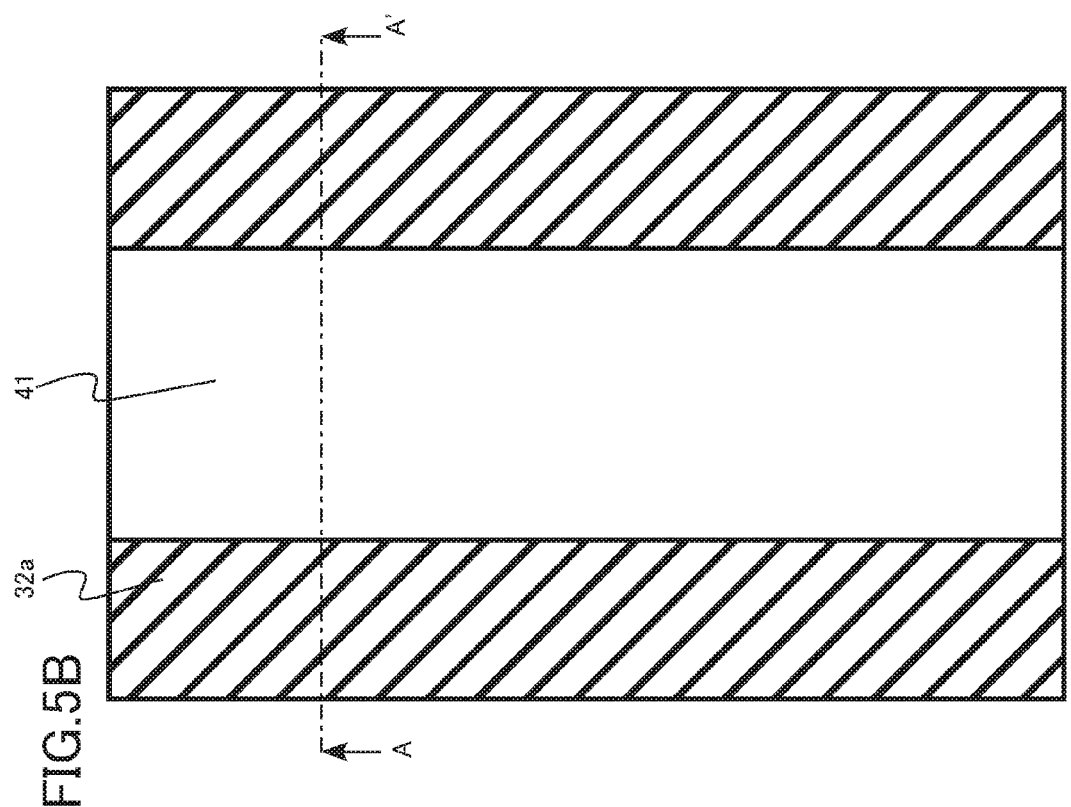
FIGS. 5A and 5B are cross-sectional views schematically illustrating the memory device which is being manufactured in the memory device manufacturing method according to the first embodiment.
Figure 5A:
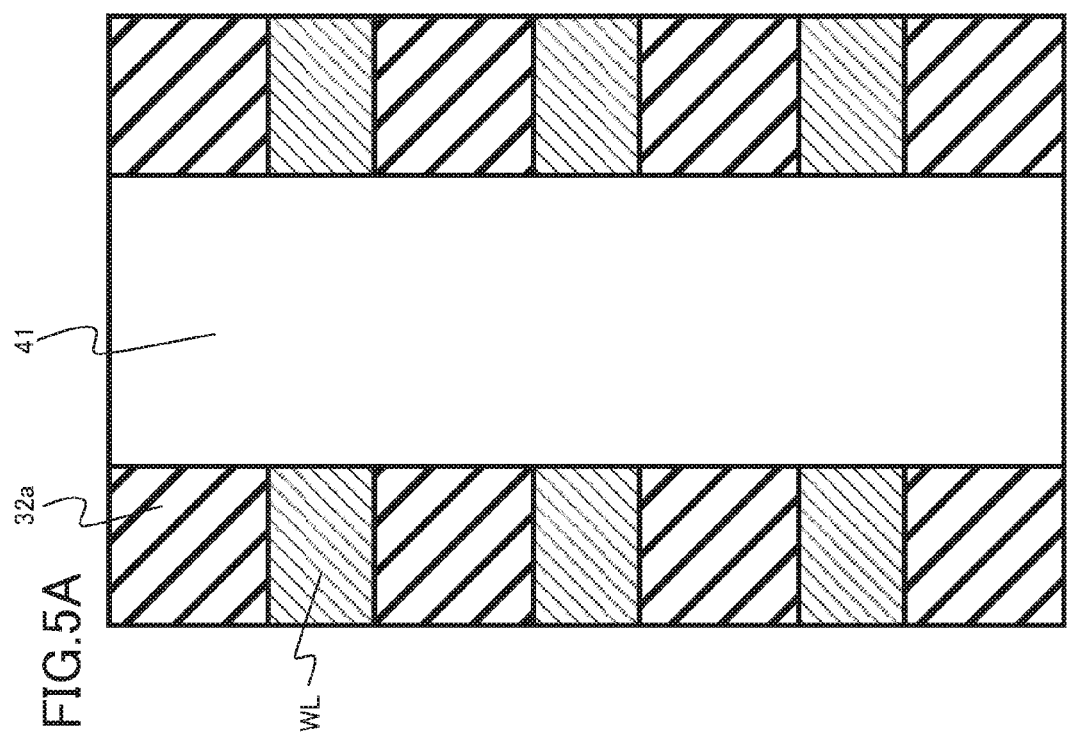

Next, the insulating film 32a and the metal film 33 are patterned by a lithography method and a reactive ion etching (RIE) method (FIGS. 5A and 5B). A groove 41 is formed by patterning. The metal film 33 is divided into the word lines WL extending in the y direction by the groove 41.

Then, an insulating film 32b is deposited to fill the groove 41. Then, the insulating film 32b is planarized by chemical mechanical polishing (CMP) (FIGS. 6A and 6B). The insulating film 32b includes at least one element X selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb).

Figure 7B:
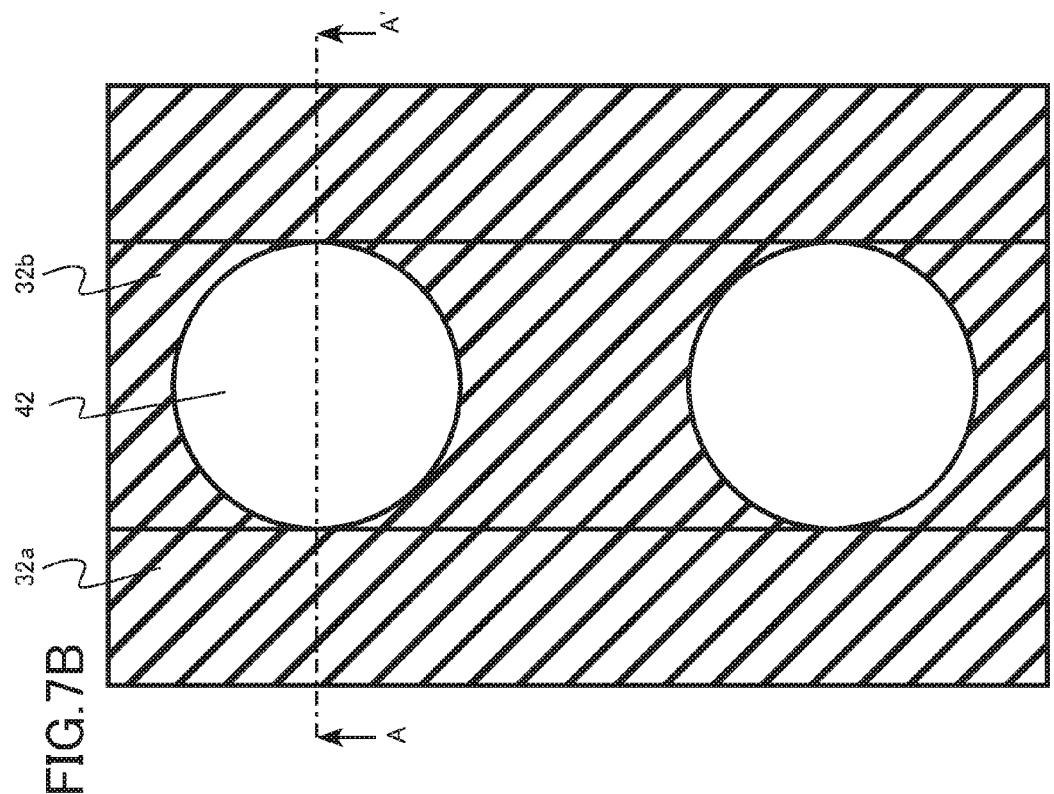
FIGS. 7A and 7B are cross-sectional views schematically illustrating the memory device which is being manufactured in the memory device manufacturing method according to the first embodiment.
Figure 7A:
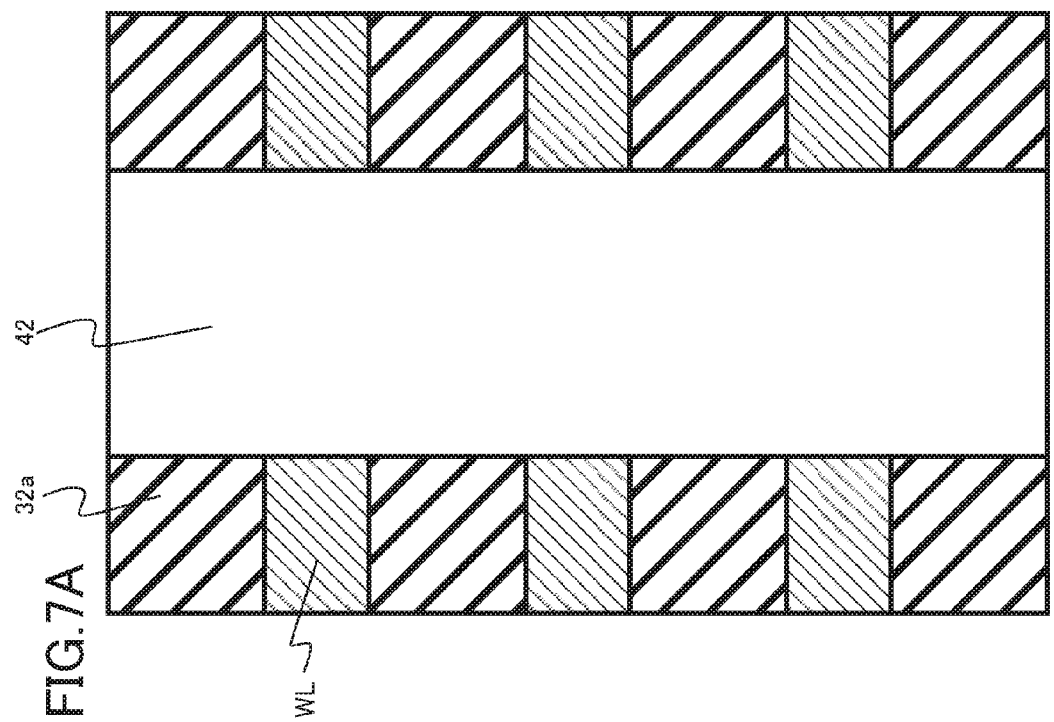

Then, an opening portion 42 that extends in the z direction is formed in the insulating film 32b (FIGS. 7A and 7B). The opening portion 42 has, for example, a cylindrical shape. The opening portion 42 is formed such that the word line WL is exposed from the side of the opening portion 42. The opening portion 42 is formed by, for example, a lithography method and an RIE method.

Then, the resistance change layer 30 is formed on the side of the opening portion 42 (FIGS. 8A and 8B). The resistance change layer 30 is a crystalline film with a superlattice structure. The resistance change layer 30 is formed by, for example, a CVD method or an atomic layer deposition (ALD) method.

Before the resistance change layer 30 is deposited, a seed layer may be formed in order to improve the crystallinity of the resistance change layer 30. The seed layer is, for example, an amorphous silicon film, an amorphous germanium film, a titanium nitride film, a metal nitride film made of titanium nitride or tungsten nitride, a metal carbide film made of tantalum carbide, a metal silicide film made of tungsten silicide, or a tungsten film.

Figure 9B:
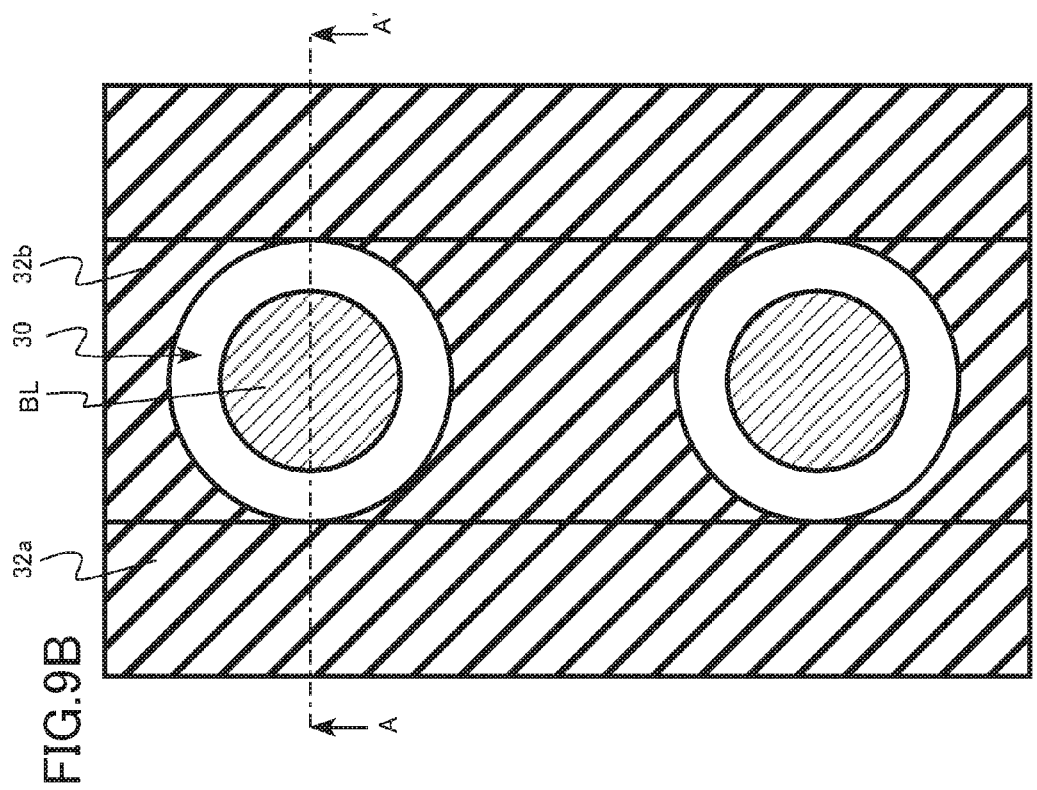
FIGS. 9A and 9B are cross-sectional views schematically illustrating the memory device which is being manufactured in the memory device manufacturing method according to the first embodiment.
Figure 9A:
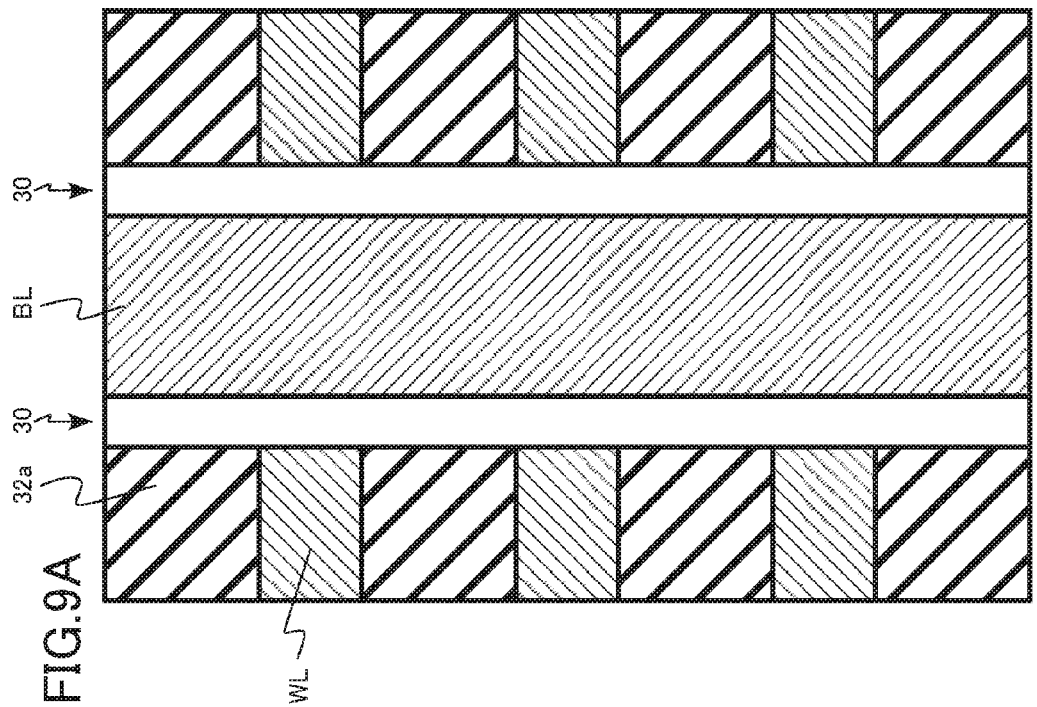

Then, the bit line BL is formed so as to fill the opening portion 42 (FIGS. 9A and 9B). The bit line BL is formed by filling the opening portion 42 with a metal film using a CVD method. The bit line BL extends in the z direction.

Figure 10A:
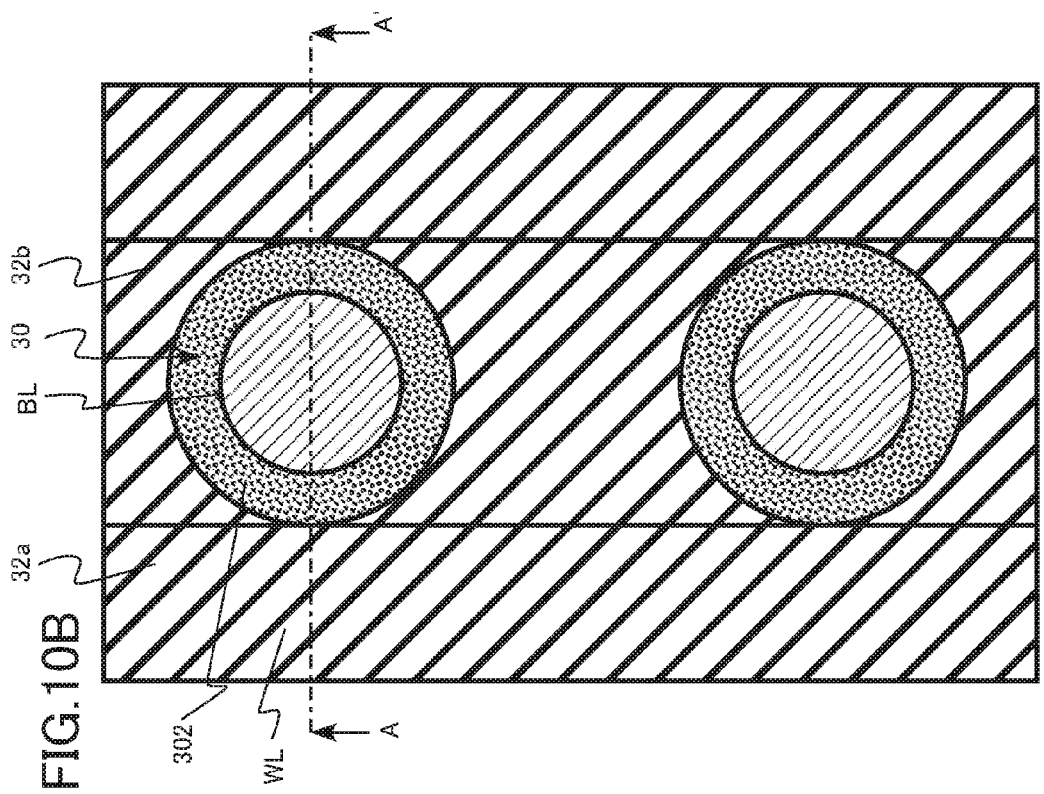
FIGS. 10A and 10B are cross-sectional views schematically illustrating the memory device which is being manufactured in the memory device manufacturing method according to the first embodiment.
Figure 10B:
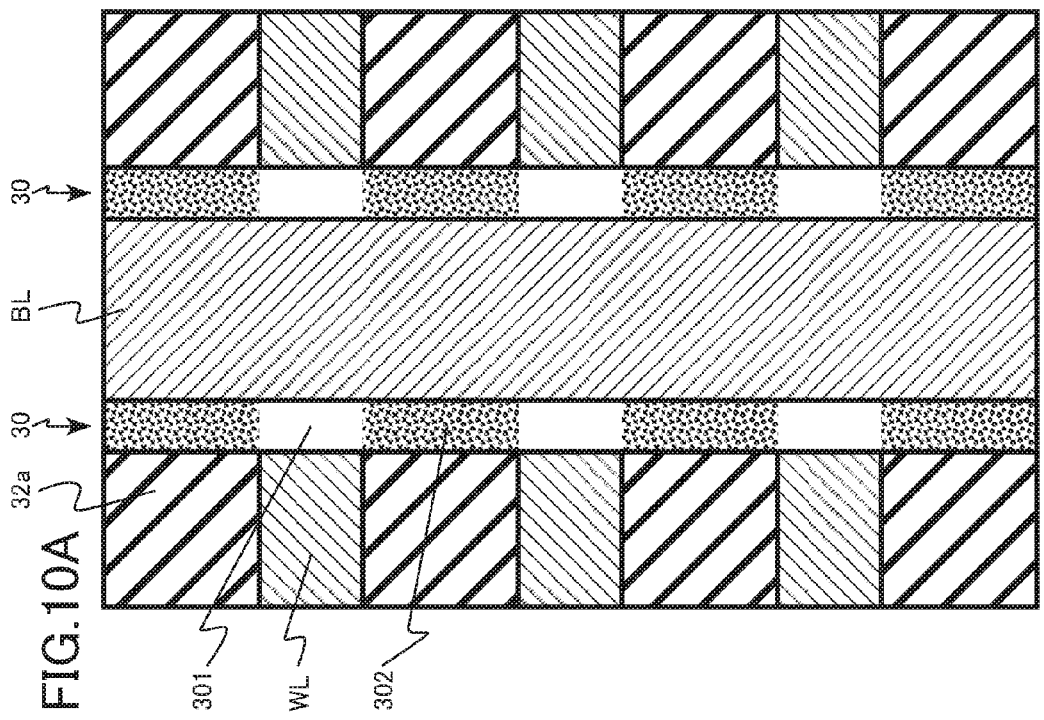

Then, a heat treatment is performed to diffuse the element X in the insulating film 32a and the insulating film 32b to a portion of the resistance change layer 30 (FIGS. 10A and 10B). A region of the resistance change layer 30 to which the element X has been diffused is the high impurity concentration region 302.

FIGS. 11A and 11B are cross-sectional views after a heat treatment is performed to diffuse the element X in the insulating film 32a and the insulating film 32b to a portion of the resistance change layer 30, similarly to FIGS. 10A and 10B. FIG. 11A is the same cross-sectional view as FIG. 10A. FIG. 11B corresponds to the cross section taken along the line BB' of FIG. 11A.

As illustrated in FIG. 11B, the element X is diffused from the insulating film 32b to a portion of the resistance change layer 30 which is interposed between two word lines WL to form the high impurity concentration region 302.

The heat treatment is performed in, for example, a non-oxidizing atmosphere. The heat treatment is performed at a temperature that is, for example, equal to or greater than 300° C. and equal to or less than 450° C.

The high impurity concentration region 302 may be changed to an amorphous state by the diffusion of the element X by the heat treatment.

The memory device 100 is manufactured by the above-mentioned manufacturing method.

Next, the function and effect of the memory device 100 according to this embodiment will be described.

Figure 13B:
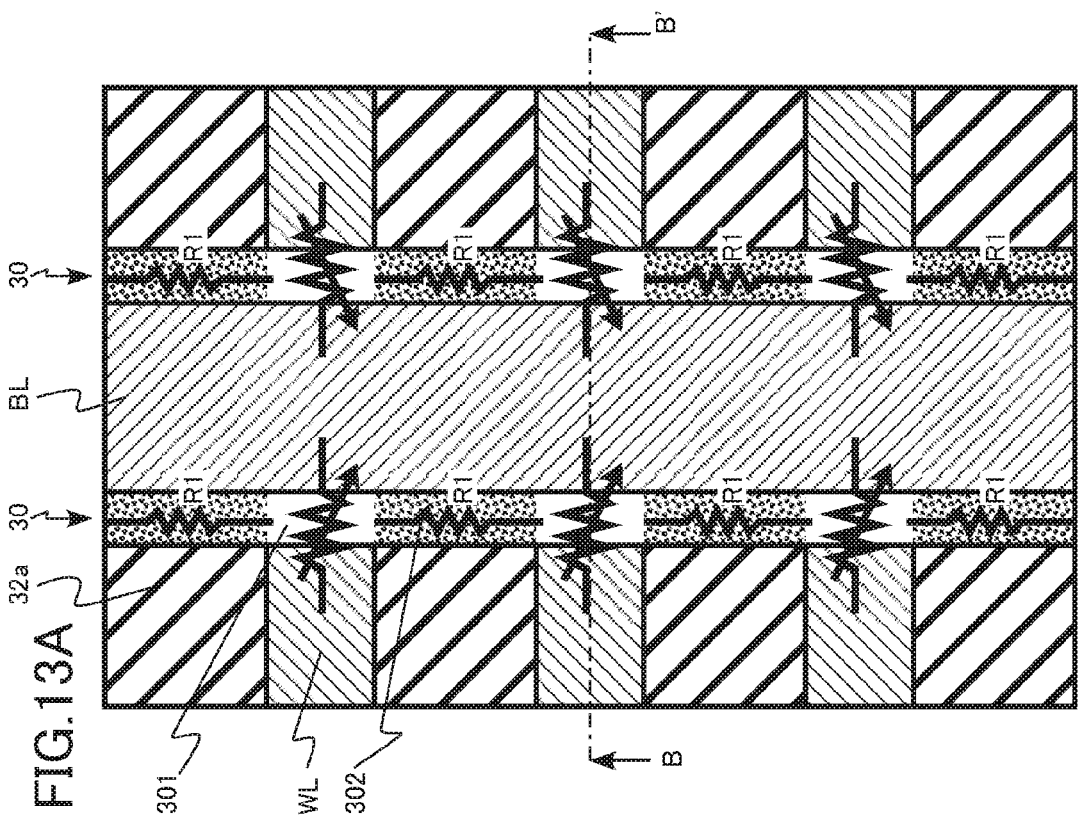
FIGS. 13A and 13B are diagrams illustrating the function and effect of the memory device according to the first embodiment.
Figure 13A:
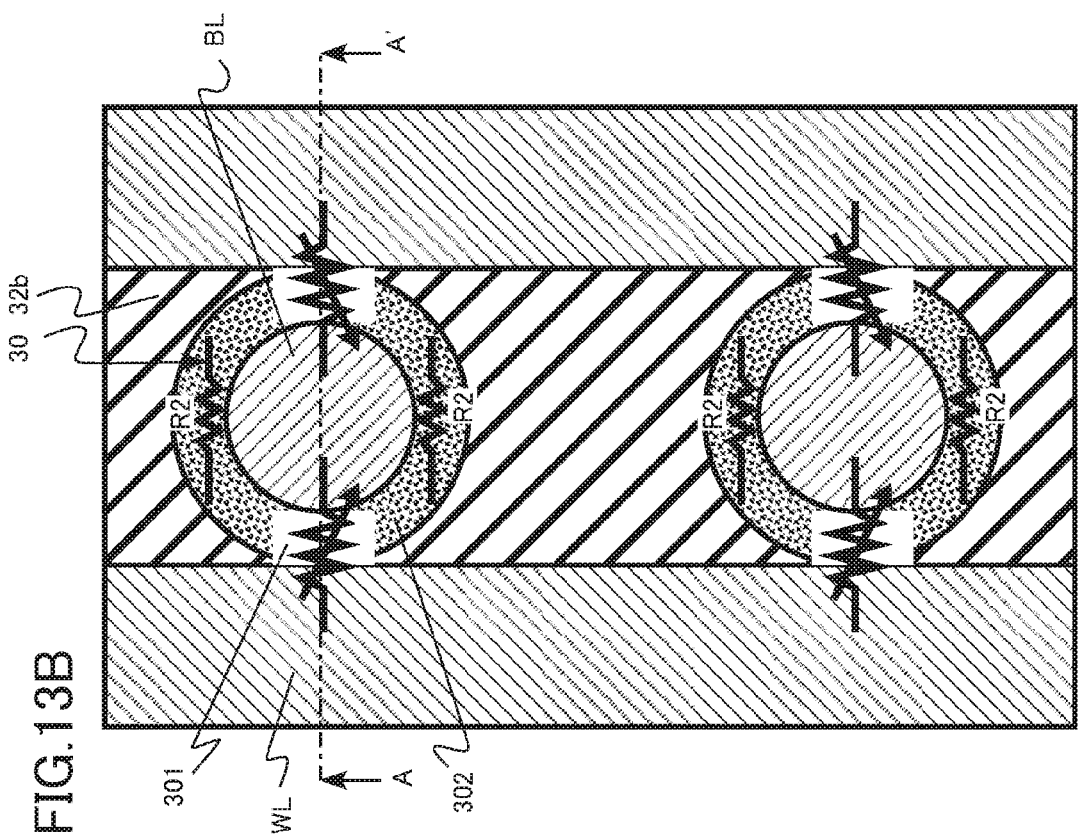

FIGS. 12A, 12B, 13A, and 13B are diagrams illustrating the function and effect of the memory device 100 according to this embodiment. FIGS. 12A and 12B are cross-sectional views schematically illustrating a memory cell array 90 of a memory device according to a comparative example. FIGS. 13A and 13B are cross-sectional views schematically illustrating the memory cell array 10 of the memory device according to this embodiment. The cell array 90 of the memory device according to the comparative example differs from the memory cell array 10 of the memory device 100 according to this embodiment in that it does not include the high impurity concentration region.

FIG. 12B corresponds to the cross section taken along the line BB' of FIG. 12A. FIG. 13B corresponds to the cross section taken along the line BB' of FIG. 13A.

In the case of the memory cell array 90 according to the comparative example, a resistance change layer 30 is a continuous crystalline film with a superlattice structure. In this case, since the conductivity of the resistance change layer 30 is high, the electric resistance (R1 in FIG. 12A) of the resistance change layer 30 disposed between the word lines WL which are adjacent to each other in the vertical direction is low. In addition, the electric resistance (R2 in FIG. 12B) of the resistance change layer 30 disposed between the word lines WL which are adjacent to each other in the horizontal direction is low. Therefore, there is a concern that mutual interference between two adjacent memory cells MC will occur. When the mutual interference between two adjacent memory cells MC occurs, there is a concern that an error in the operation of a memory will occur.

For example, there is a concern that adjacent word lines WL will be short-circuited and the writing of data to a desired memory cell MC, the erasing of data from a desired memory cell MC, or the reading of data from a desired memory cell MC will not be performed.

In the memory device 100 according to this embodiment, as illustrated in FIGS. 13A and 13B, the resistance change layer 30 disposed between adjacent word lines WL becomes the high impurity concentration region 302 including the element X at high concentration. Therefore, the electric resistance (R1 in FIG. 13A and R2 in FIG. 13B) of the resistance change layer 30 disposed between adjacent word lines WL is high. As a result, the mutual interference between two adjacent memory cells MC is prevented. Therefore, an error in the operation of a memory is prevented and the memory device 100 that operates stably is achieved.

For example, the element X is diffused from the insulating layer 32 (the insulating film 32a and the insulating film 32b) into the high impurity concentration region 302.

For example, when the element X is oxygen (O), an oxide with high electric resistivity is formed in the high impurity concentration region 302. Therefore, the electric resistivity of the high impurity concentration region 302 increases. When the element X is oxygen (O), for example, silicon oxide or silicon oxynitride is used as the insulating layer 32.

For example, when the element X is fluorine (F), fluorine with high electronegativity terminates a dangling bond caused by tellurium (Te) defects and the concentration of holes caused by the Te defects is reduced. Therefore, the electric resistivity of the high impurity concentration region 302 increases. When the element X is fluorine (F), for example, fluorinated silicon oxide (SiOF), fluorinated silicon nitride (SiNF), or fluorinated silicon oxynitride (SiONF) including fluorine is used as the insulating layer 32.

For example, when the element X is carbon (C), carbon terminates a dangling bond caused by tellurium (Te) defects and the concentration of holes caused by the Te defects is reduced. Therefore, the electric resistivity of the high impurity concentration region 302 increases. When the element X is carbon (C), for example, silicon oxycarbide (SiOC), silicon carbonitride (SiCN), or silicon oxycarbonitride (SiOCN) including carbon is used as the insulating layer 32.

For example, when the element X is phosphorous (P), phosphorous (P) become a scattering source of carriers in the high impurity concentration region 302 and the mobility of the carriers is reduced. Therefore, the electric resistivity of the high impurity concentration region 302 increases. When the element X is phosphorous (P), for example, phoshosilicate glass (PSG) or a boro-phoshosilicate glass (BPSG) is used as the insulating layer 32.

For example, when the element X is boron (B), boron (B) become a scattering source of carriers in the high impurity concentration region 302 and the mobility of the carriers is reduced. Therefore, the electric resistivity of the high impurity concentration regions 302a to 302d increases. When the element X is boron (B), for example, borosilicate glass (BSG) or boro-phoshosilicate glass (BPSG) is used as the insulating layer 32.

For example, when the element X is nitrogen (N), a nitride with high electric resistivity is formed in the high impurity concentration region 302. Therefore, the electric resistivity of the high impurity concentration region 302 increases.

When the resistance change layer 30 includes a stacked structure of an $Sb_2Te_3$ layer and a GeTe layer, the $Sb_2Te_3$ layer is changed to a p-type semiconductor by tellurium (Te) defects in the $Sb_2Te_3$ layer. For example, when the element X is nitrogen (N), nitrogen terminates a dangling bond caused by tellurium (Te) defects and the concentration of holes caused by the Te defects is reduced. Therefore, the electric resistivity of the high impurity concentration region 302 increases. When the element X is nitrogen (N), for example, silicon nitride or silicon oxynitride is used as the insulating layer 32.

For example, when the element X is hydrogen (H), hydrogen terminates a dangling bond caused by tellurium (Te) defects and the concentration of holes caused by the Te defects is reduced. Therefore, the electric resistivity of the high impurity concentration region 302 increases. When the element X is hydrogen (H), for example, silicon oxide, silicon nitride, or silicon oxynitride including hydrogen is used as the insulating layer 32.

As described above, when the resistance change layer 30 includes a stacked structure of an $Sb_2Te_3$ layer and a GeTe layer, the $Sb_2Te_3$ layer is changed to a p-type semiconductor by tellurium (Te) defects in the $Sb_2Te_3$ layer.

For example, when the element X is bismuth (Bi), antimony (Sb) in the $Sb_2Te_3$ layer is substituted with bismuth (Bi) and $Bi_2Te_3$ is formed in the high impurity concentration region 302. Since $Bi_2Te_3$ is an n-type semiconductor, the electric resistivity of the high impurity concentration region 302 increases. When the element X is bismuth (Bi), for example, silicon oxide including bismuth is used as the insulating layer 32.

For example, when the element X is cadmium (Cd), zinc (Zn), gallium (Ga), selenium (Se), aluminum (Al), or sulfur (S), the element X substitutes tellurium (Te) in an $Sb_2Te_3$ layer and forms a compound with antimony. The compound of the element X and antimony has a higher bandgap than $Sb_2Te_3$. Therefore, the electric resistivity of the high impurity concentration region 302 increases.

In particular, when the element X is selenium (Se) or sulfur (S) having the same valence as tellurium (Te), it is easy for the element X to substitute X tellurium (Te) and $Sb_2X_yTe_{3-y}$ having the same crystal structure as $Sb_2Te_3$ is obtained, which is preferable.

When the element X is cadmium (Cd), zinc (Zn), gallium (Ga), selenium (Se), aluminum (Al), or sulfur (S), for example, silicon oxide including cadmium, zinc, gallium, selenium, aluminum, or sulfur is used as the insulating layer 32.

For example, when the element X is beryllium (Be), zinc (Zn), gallium (Ga), cadmium (Cd), indium (In), or lead (Pb), the element X substitutes antimony (Sb) in an $Sb_2Te_3$ layer and forms a compound with tellurium. The compound of the element X and tellurium has a higher bandgap than $Sb_2Te_3$. Therefore, the electric resistivity of the high impurity concentration region 302 increases. When the element X is beryllium (Be), zinc (Zn), gallium (Ga), cadmium (Cd), indium (In), or lead (Pb), for example, silicon oxide including beryllium, zinc, gallium, cadmium, indium, or lead is used as the insulating layer 32.

The concentration of the element X in the high impurity concentration region 302 is preferably equal to or greater than $1 \times 10^{16}$ cm$^{-3}$, more preferably equal to or greater than $1 \times 10^{17}$ cm$^{-3}$, and most preferably equal to or greater than $1 \times 10^{18}$ cm$^{-3}$, in order to increase the electric resistance of the high impurity concentration region 302.

The concentration of the element X in the high impurity concentration region 302 is preferably higher than the concentration of the element X in the low impurity concentration region 301 by one digit or more and more preferably by two digits or more, in order to increase the electric resistance of the high impurity concentration region 302 to be higher than the electric resistance of the low impurity concentration region 301.

It is preferable that the high impurity concentration regions 302a to 302d be amorphous in order to increase the electric resistance of the high impurity concentration region 302.

The memory device 100 according to this embodiment has a three-dimensional structure in which the bit lines BL are provided in the z direction, that is, the vertical direction, as illustrated in FIGS. 2 and 3. In this case, it is difficult to selectively remove the resistance change layer 30 provided between adjacent word lines WL during manufacture.

Therefore, in the structure of the memory device 100 according to this embodiment, it is preferable that the element X be added to increase the resistance of the resistance change layer 30 disposed between adjacent word lines WL, thereby preventing the mutual interference between two adjacent memory cells MC. For example, the resistance of the resistance change layer 30 disposed between adjacent word lines WL can be increased in a self-aligned manner by the diffusion of the element X from the insulating layer 32.

As described above, according to this embodiment, it is possible to achieve the memory device 100 that can prevent the mutual interference between adjacent memory cells MC.

Second Embodiment

A memory device according to this embodiment differs from the memory device according to the first embodiment in that a memory cell array has a two-dimensional structure. Hereinafter, the description of the same content as that in the first embodiment will not be repeated.

Figure 14:
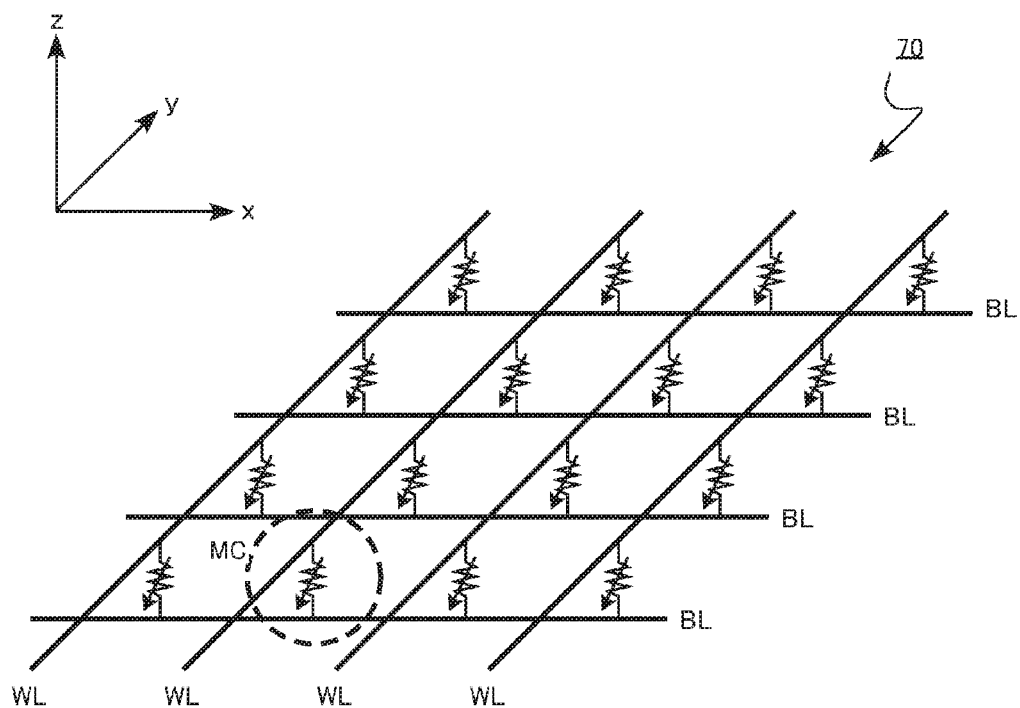
FIG. 14 is an equivalent circuit diagram illustrating a memory cell array according to a second embodiment.
Figure 15:
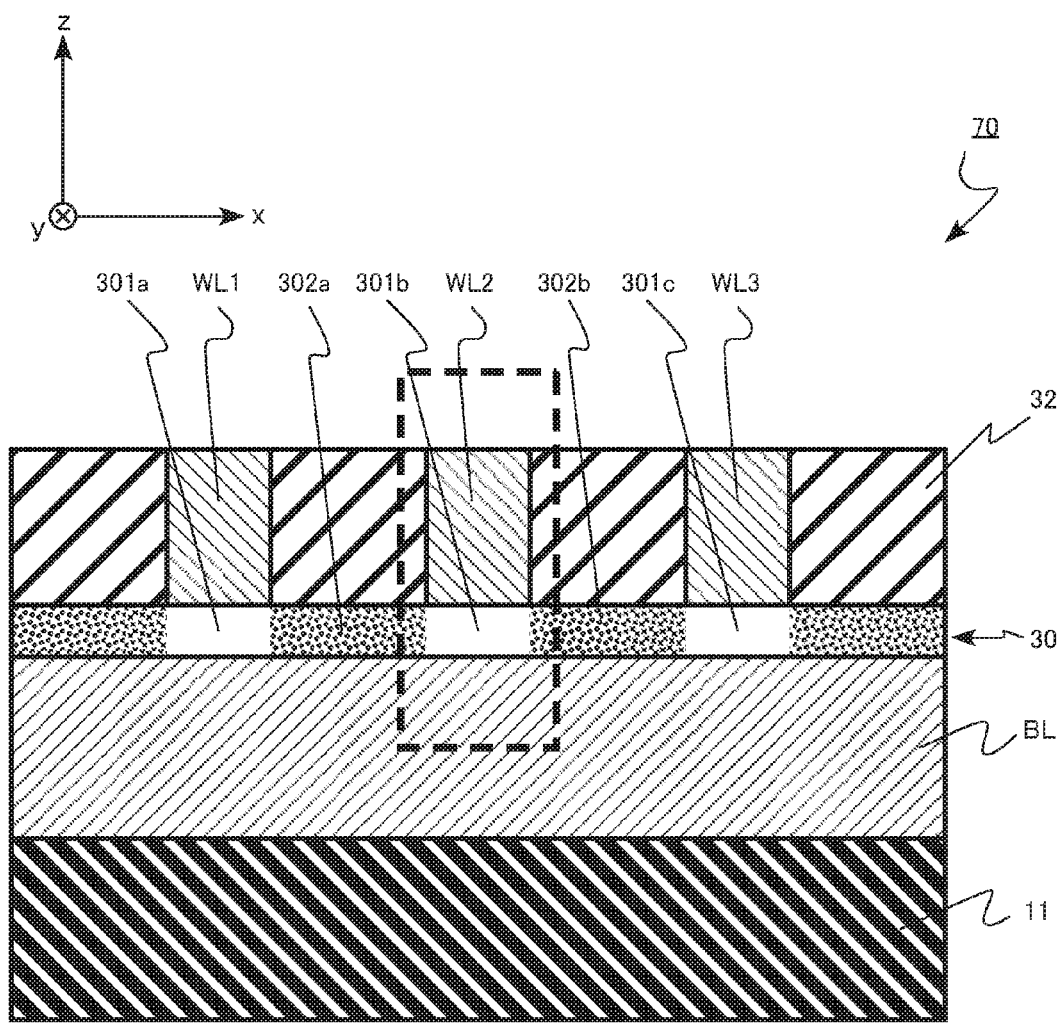
FIG. 15 is a cross-sectional view schematically illustrating a memory device according to the second embodiment.

FIG. 14 is an equivalent circuit diagram illustrating the memory cell array of the memory device according to this embodiment. FIG. 15 schematically illustrates a wiring structure in the memory cell array.

As illustrated in FIG. 14, a memory cell array 70 includes a plurality of memory cells MC which are two-dimensionally arranged. In FIG. 14, a region surrounded by a dashed line corresponds to one memory cell MC.

The memory cell array 70 includes a plurality of word lines WL and a plurality of bit lines BL. The word line extends in the y direction. The bit line BL extends in the x direction. The word line WL and the bit line BL are perpendicular to each other. The memory cell MC is disposed at an intersection portion between the word line WL and the bit line BL. The memory cell array 70 is a so-called cross-point memory cell array.

FIG. 15 is a cross-sectional view parallel to the xz plane in FIG. 14. FIG. 15 is a cross-sectional view illustrating one bit line BL and three word lines WL that intersect the one bit line BL in FIG. 14. In FIG. 15, a region surrounded by a dashed line is one memory cell MC.

The memory cell array 70 includes a substrate insulating layer 11, a first word line WL1 (first conductive layer), a second word line WL2 (second conductive layer), a third word line WL3, a resistance change layer 30, and an insulating layer 32. The resistance change layer 30 includes a low impurity concentration region 301a (first region), a low impurity concentration region 301b (second region), and a low impurity concentration region 301c. In addition, the resistance change layer 30 includes a high impurity concentration region 302a (third region) and a high impurity concentration region 302b.

According to this embodiment, a memory device that can prevent mutual interference between adjacent memory cells MC can be achieved by the same function as that in the first embodiment.

For example, the memory cell array 70 according to this embodiment may be repeatedly stacked in an upward direction (the z direction in FIGS. 14 and 15) to form a memory device with a three-dimensional structure. In addition, a WL electrode may be shared by a memory cell above the word line WL and a memory cell below the word line WL. In this case, it is possible to increase the degree of integration of the memory cells.

In the first and second embodiments, in the superlattice structure of the low impurity concentration region 301, the $Sb_2Te_3$ layer and the GeTe layer are alternately stacked. However, the low impurity concentration region 301 is not necessarily limited to the superlattice structure in which the $Sb_2Te_3$ layer and the GeTe layer are alternately stacked. Any superlattice structure can be applied as long as it can change a resistance state.

For example, a superlattice structure in which a first crystal layer made of a first chalcogen compound other than $Sb_2Te_3$ and a second crystal layer made of a second chalcogen compound different from the first chalcogen compound are alternately stacked may be used. In addition, for example, a superlattice structure in which a first crystal layer made of a first chalcogen compound and a second crystal layer made of a second chalcogen compound which is other than GeTe and is different from the first chalcogen compound are alternately stacked may be used.

For example, $Bi_2Te_3$, $HfTe_2$, $Cu_2Te$, or SnTe can be used as the first chalcogen compound other than $Sb_2Te_3$.

In the first and second embodiments, the resistance change layer 30 is provided so as to come into contact with the word line WL and the bit line BL. However, a layer other than the resistance change layer 30 may be interposed between the word line WL and the resistance change layer 30 or between the bit line BL and the resistance change layer 30. For example, in order to achieve a rectifying action between the word line WL and the bit line BL, for example, a semiconductor layer doped with conductive impurities or a conductive oxide layer may be interposed as a selector between the word line WL and the resistance change layer 30 or between the bit line BL and the resistance change layer 30 so as to be connected in series to the resistance change layer 30.

In the first and second embodiments, the high resistance state is defined as data "0" and the low resistance state is defined as data "1". However, the high resistance state may be defined as data "1" and the low resistance state may be defined as data "0".

While certain embodiments have been described, these embodiments have been presented by way of example only, and are not intended to limit the scope of the inventions. Indeed, the memory devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
a first conductive layer extending in a first direction;
a second conductive layer extending in the first direction;
a third conductive layer intersecting the first conductive layer and the second conductive layer, the third conductive layer extending in a second direction crossing the first direction; and
a resistance change layer including a first region provided between the first conductive layer and the third conductive layer, a second region provided between the second conductive layer and the third conductive layer, and a third region provided between the first region and the second region, the first region having a superlattice structure, the second region having a superlattice structure, the third region including at least one element selected from the group consisting of oxygen (O), fluorine (F), carbon (C), phosphorous (P), boron (B), nitrogen (N), hydrogen (H), bismuth (Bi), cadmium (Cd), zinc (Zn), gallium (Ga), selenium (Se), aluminum (Al), sulfur (S), beryllium (Be), indium (In), and lead (Pb), concentration of the at least one element in the third region being higher than that in the first region and the second region.

2. The memory device according to claim 1, further comprising:
an insulating layer provided between the first conductive layer and the second conductive layer, the insulating layer including the at least one element.

3. The memory device according to claim 2,
wherein the insulating layer is made of silicon oxide or silicon oxynitride.

4. The memory device according to claim 1,
wherein the third region is amorphous.

5. The memory device according to claim 1,
wherein the resistance change layer includes antimony (Sb), tellurium (Te), and germanium (Ge).

6. The memory device according to claim 1,
wherein the concentration of the at least one element in the third region is equal to or greater than $1 \times 10^{16}$ cm$^{-3}$.

7. The memory device according to claim 1,
wherein the first region and the second region have a superlattice structure in which a first crystal layer made of a first chalcogen compound and a second crystal layer made of a second chalcogen compound different from the first chalcogen compound are alternately stacked.

8. The memory device according to claim 7,
wherein the first crystal layer is an $Sb_2Te_3$ layer and the second crystal layer is a GeTe layer.

9. The memory device according to claim 1,
wherein a thickness of the resistance change layer is equal to or greater than 5 nm and equal to or less than 50 nm.

10. The memory device according to claim 1,
wherein the first conductive layer and the second conductive layer are electrically connected to a row decoder circuit and the third conductive layer is electrically connected to a sense amplifier circuit.

11. The memory device according to claim 1,
wherein the second conductive layer is provided below the first conductive layer.

* * * * *